(12) United States Patent
Kaya et al.

(10) Patent No.: US 6,795,480 B1
(45) Date of Patent: Sep. 21, 2004

(54) SEMICONDUCTOR LASER DEVICE

(75) Inventors: Shusuke Kaya, Yokohama (JP); Takao Ninomiya, Yokohama (JP); Michio Okubo, Fujisawa (JP); Seiji Uchiyama, Fujisawa (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/662,704

(22) Filed: Sep. 15, 2000

(30) Foreign Application Priority Data

Sep. 16, 1999 (JP) .......................................... 11-261639

(51) Int. Cl.[7] ................................................. H01S 3/08
(52) U.S. Cl. .............................. 372/99; 372/45; 372/49
(58) Field of Search ............................. 372/45, 49, 99; 338/22; 438/29; 524/440

(56) References Cited

U.S. PATENT DOCUMENTS

| 4,647,895 A | * | 3/1987 | Howng ........................ 338/22 |
| 4,749,255 A | * | 6/1988 | Chakrabarti et al. .......... 372/45 |
| 5,440,575 A | * | 8/1995 | Chand et al. .................. 372/49 |
| 5,744,533 A | * | 4/1998 | Iwamoto et al. ............. 524/440 |
| 6,067,310 A | * | 5/2000 | Hashimoto et al. ............ 372/45 |
| 6,249,534 B1 | * | 6/2001 | Itoh et al. ...................... 372/49 |
| 6,323,052 B1 | * | 11/2001 | Horie et al. ................... 438/46 |

* cited by examiner

Primary Examiner—Don Wong
Assistant Examiner—Cornelius H Jackson
(74) Attorney, Agent, or Firm—Oblon, Spivak, McClelland, Maier & Neustadt, P.C.

(57) ABSTRACT

A semiconductor laser device is formed by laminating optical confinement layers and active layers so as to dispose each of said active layers between said optical confinement layers, wherein one of the opposite ends perpendicular to the junction planes of the individual layers in the semiconductor multi-layer film is coated with a low reflection film and the other of the ends is coated with a high reflection film, wherein the low reflection film is an $Al_2O_3$ film having a resistivity of $1\times10^{12}$ $\Omega\cdot m$ or more, preferably $1\times10^{13}$ $\Omega\cdot m$ or more, and having a stoichiometric ratio composition, which is deposited by, for example, an electron cyclotron resonance sputtering process. The present invention has realized a semiconductor laser device exhibiting a prolonged duration of operating life and having high driving reliability, which is advantageous in that a catastrophic optical damage hardly occurs and a lowering of the optical output after driving at a constant current is suppressed, and thus, it is preferably used as an optical transmitter for the optical communication.

22 Claims, 3 Drawing Sheets

SEMICONDUCTOR LASER DEVICE

BACKGROUND OF THE INVENTION

1. Field of the Invention

The present invention relates to a semiconductor laser device exhibiting a prolonged duration of operating life, which is advantageously used as an optical transmitter for the optical communication.

2. Description of the Prior Art

A semiconductor laser device basically has a device structure such that it comprises a semiconductor multi-layer film having optical confinement layers formed on both surfaces of active layers, and electrodes which are respectively formed on the upper surface and the lower surface of the semiconductor multi-layer film. The semiconductor multi-layer film is formed by successively laminating a plurality of semiconductor layers (compound semiconductor layers) having different compositions on a predetermined semiconductor substrate using, for example, epitaxial growth. Then, the semiconductor laser device constitutes an optical cavity relative to the laser pumped in the active layer by cleaving the above-mentioned semiconductor multi-layer film containing the electrodes in the direction perpendicular to the junction planes of the individual layers therein and allowing the opposite cleaved planes to function as ends of optical cavity.

Further, in general, one of the above-mentioned ends of optical cavity (cleaved planes) is coated with a high reflection film, and the other end of the optical cavity is coated with a low reflection film. These reflection films not only adjust the reflectance on the optical cavity end relative to the laser pumped in the active layer but also play a role of protecting the cleaved planes. The above low reflection film is formed as a single-layer film comprised of an oxide material (dielectric material) having a low refractive index, for example, aluminum oxide, silicon oxide or the like. In addition, the high reflection film is formed as a composite film obtained by alternately laminating, for example, the above-mentioned low reflection film and a film comprised of a material having a high refractive index, such as Si or the like. Such reflection films are formed by vapor deposition generally using a sputtering process.

By the way, when a semiconductor laser device having the above-described device structure is driven at a constant current, the optical output lowers with the lapse of time, and the lasing is finally stopped. Such a phenomenon is caused by a number of factors, and one of the factors is a problem of catastrophic optical damage.

This catastrophic optical damage is a phenomenon caused by the increased non-radiative recombination due to oxidation of the ends of the optical cavity during the driving of the semiconductor laser device. Such a phenomenon considerably lowers, for example, the driving reliability of the semiconductor laser device used as an optical transmitter for the optical communication, and thus, the improvement thereof has been strongly desired. Especially when the active layers and the semiconductor layers (optical confinement layers, and the like) near the active layers are comprised of an Al-containing compound semiconductor material, and in addition, the low reflection film (protection film) formed on the optical cavity end is an $Al_2O_3$ film, a problem arises in that the above-described catastrophic optical damage markedly occurs.

SUMMARY OF THE INVENTION

In the course of the studies made for solving the above problems, with respect to the phenomenon wherein, in the case where an $Al_2O_3$ film is deposited on the optical cavity end (cleaved plane) of the semiconductor laser device as a protection film (reflection film) therefor, when the active layers and the semiconductor layers near the active layers are comprised of an Al-containing compound semiconductor material, a catastrophic optical damage markedly occurs, the present inventors have made the following observations.

(1) When an $Al_2O_3$ film is deposited by a sputtering process which is generally employed as a method for depositing a protection film, the composition of the resultant film does not necessarily have a stoichiometric ratio. Rather, the $Al_2O_3$ film may contain an oxygen component in a stoichiometrically excess amount.

(2) In such a case, the excess amount of the oxygen component in the $Al_2O_3$ film is liberated due to the heat generated during the driving of the semiconductor laser device and the like, and diffused toward the cleaved plane side. Thus, the oxygen component diffused toward the cleaved plane side oxidizes the Al component of the Al-containing compound semiconductor material constituting the optical cavity ends (cleaved planes). It is considered that, as a result, a catastrophic optical damage occurs in the optical cavity.

(3) When the $Al_2O_3$ film stoichiometically lacks the oxygen component, the amount of the metal Al component becomes large, so that a current easily flows through the $Al_2O_3$ film when an electric field is applied thereto. Thus, this current causes the metal Al component and the Al component of the Al-containing compound semiconductor material constituting the optical cavity ends (cleaved planes) to undergo oxidation, so that a catastrophic optical damage easily occurs in the optical cavity similarly to the above case.

(4) Therefore, by using, as the $Al_2O_3$ film deposited on the optical cavity end, one that has the oxygen component which is not in a stoichiometrically excess amount, namely, has a composition such that the Al component and the oxygen component approximate to the stoichiometric ratio as closely as possible, the diffusion of the oxygen component and the oxidation of the Al-containing compound semiconductor material caused by the diffusion can be suppressed. Further, it has been considered that, by suppressing the oxidation of the Al-containing compound semiconductor material, it is possible to suppress the occurrence of a catastrophic optical damage in the optical cavity.

(5) In addition, it is considered that, by using, as the $Al_2O_3$ film deposited on the optical cavity end, one that does not stoichiometically lack the oxygen component, namely, has a composition such that the Al component and the oxygen component approximate to the stoichiometric ratio as closely as possible, the oxidation of the Al-containing compound semiconductor material is suppressed, thus making it possible to suppress the occurrence of a catastrophic optical damage in the optical cavity.

Based on the above observations, the present inventors have made various studies on the deposition of an $Al_2O_3$ film. As a result, it has been found that, when an $Al_2O_3$ film is deposited on the end of the optical cavity by, for example, the below-mentioned electron cyclotron resonance sputtering (hereinafter, referred to as "ECR") process, the resultant $Al_2O_3$ film is a film having a stoichiometric ratio composition. It is considered that, since sputtering is performed using a pure metal (Al) as a target in an oxygen atmosphere in the ECR process, the sputtered pure metal (Al) adheres to the optical cavity end while incorporating thereinto the required amount of oxygen in the atmosphere, so that the $Al_2O_3$ film deposited on the optical cavity end has a stoichiometric ratio composition. On the contrary, it is considered that, in the conventionally known sputtering process, alumina ($Al_2O_3$) is used as a target, and therefore, the composition for the molecules of the alumina sputtered varies depending on the manner of sputtering, so that the oxygen component of the $Al_2O_3$ film deposited on the optical cavity end is stoichiometrically changed.

Further, it has also been found that the resistivity of the $Al_2O_3$ film deposited using the above-mentioned ECR process is a considerably high value, as compared to that of the $Al_2O_3$ film deposited by the general sputtering process. In addition, it has been found that the semiconductor laser device having an $Al_2O_3$ film deposited which has such a high resistivity and a stoichiometric ratio composition is advantageous in that a catastrophic optical damage is considerably suppressed and almost no lowering of the optical output occurs after driving for a long time, resulting in a semiconductor laser device having high driving reliability, and thus, the present invention has been completed.

Thus, the semiconductor laser device of the present invention is characterized in that, as the low reflection film and/or high reflection film with which the end of the optical cavity is coated, an $Al_2O_3$ film having a stoichiometric ratio composition and having a resistivity of $1\times10^{12}$ Ω·m or more is used. Further, the semiconductor laser device is characterized in that the above $Al_2O_3$ film is deposited by, for example, an electron cyclotron resonance plasma sputtering process.

Specifically, in the present invention, there is provided a semiconductor laser device comprising a semiconductor multi-layer film formed by laminating optical confinement layers and active layers so as to dispose each of the active layers between the optical confinement layers, wherein one of the opposite ends perpendicular to the junction planes of the individual layers in the semiconductor multi-layer film is coated with a low reflection film and the other of the ends is coated with a high reflection film, wherein the low reflection film contains a film comprised of at least $Al_2O_3$ having a resistivity of $1\times10^{12}$ Ω·m or more.

Preferably, the low reflection film is formed as a single layer. Alternatively, the low reflection film is formed as a film comprised of a plurality of layers. In this case, the plurality of layers are realized as a composite film formed from a film comprised of the above $Al_2O_3$ and a film which contains Si and has a refractive index higher than that of the $Al_2O_3$. Particularly, it is preferred that, as the film which has a refractive index higher than that of the $Al_2O_3$, one that is selected from the group consisting of Si, α(amorphous)-Si and SiN is used.

Further, preferably, the high reflection film contains a film comprised of at least $Al_2O_3$ having a resistivity of $1\times10^{12}$ Ω·m or more. Particularly, the high reflection film is realized as a composite film formed from a film comprised of the above $Al_2O_3$ and a film which contains Si and has a refractive index higher than that of the $Al_2O_3$. Also in this case, it is preferred that, as the film which contains Si, one that is selected from the group consisting of Si, α(amorphous)-Si and SiN is used.

In addition, in the present invention, there is provided a semiconductor laser device comprising a semiconductor multi-layer film formed by laminating optical confinement layers and active layers so as to dispose each of the active layers between the optical confinement layers, wherein one of the opposite ends perpendicular to the junction planes of the individual layers in the semiconductor multi-layer film is coated with a low reflection film and the other of the ends is coated with a high reflection film, wherein the low reflection film contains a film comprised of $Al_2O_3$ having a stoichiometric ratio composition.

Also in this invention, preferably, the low reflection film is formed as a single layer. Alternatively, the low reflection film is formed as a film comprised of a plurality of layers. In this case, the plurality of layers are realized as a composite film formed from a film comprised of the above $Al_2O_3$ and a film which contains Si and has a refractive index higher than that of the $Al_2O_3$. Particularly, it is preferred that, as the film which contains Si, one that is selected from the group consisting of Si, α(amorphous)-Si and SiN is used.

Further, preferably, as the high reflection film, one that contains a film comprised of at least $Al_2O_3$ having a substantially stoichiometric ratio composition is used. Preferably, the high reflection film is realized as a composite film formed from a film comprised of the above $Al_2O_3$ and a film which contains Si and has a refractive index higher than that of the $Al_2O_3$. In this case, particularly, as the film which has a refractive index higher than that of the $Al_2O_3$, one that is selected from the group consisting of Si, α(amorphous)-Si and SiN is used.

Further, the present invention is characterized in that the above-mentioned $Al_2O_3$ film is deposited by an electron cyclotron resonance plasma sputtering process, an electron beam evaporation process, or an electron beam sputtering process.

DETAILED DESCRIPTION OF THE INVENTION

Figure 1:
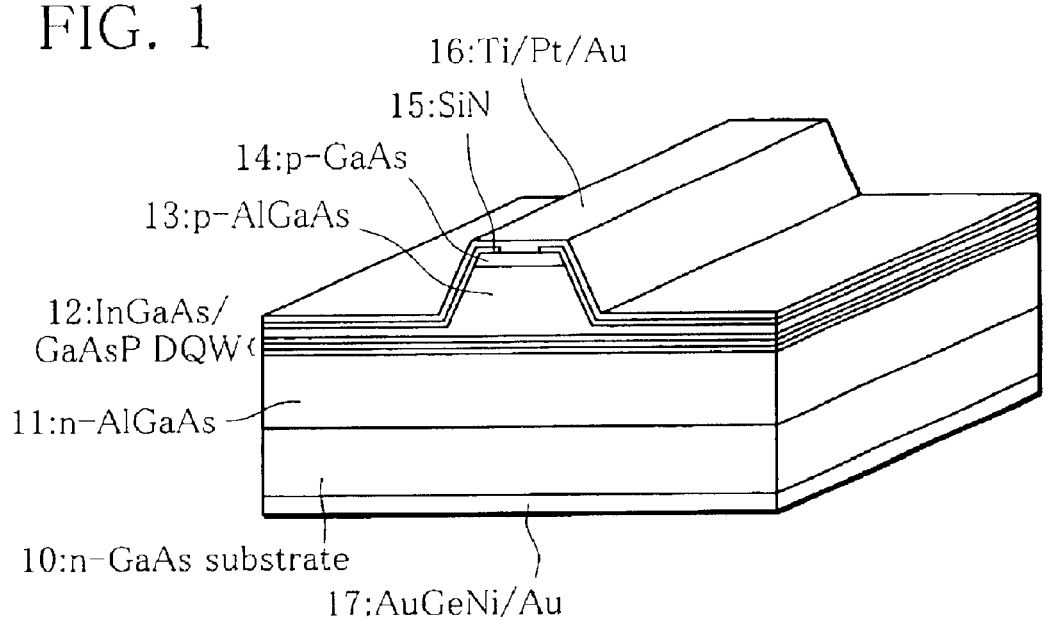
FIG. 1 is a perspective view showing a diagrammatic device structure of the semiconductor laser device according to one embodiment of the present invention.

FIG. 1 shows a diagrammatic device structure of the semiconductor laser device according to the present invention, and in FIG. 1, numeral 10 denotes a semiconductor substrate comprised of n-GaAs. The semiconductor laser device is realized as a semiconductor multi-layer film formed by successively laminating, on the semiconductor substrate 10, a first optical confinement layer (lower cladding layer) 11 comprised of n-AlGaAs, an active layer 12 comprised of InGaAs/GaAsP having a quantum well structure, and a second optical confinement layer (upper cladding layer) 13 comprised of p-AlGaAs, and depositing a cap layer 14 comprised of p-GaAs on the above layers. The growth of such a semiconductor multi-layer film is conducted using liquid phase epitaxy, vapor phase epitaxy, molecular beam epitaxy or the like. In addition, the above-described second optical confinement layer (upper cladding layer) 13 and cap layer 14 are mesa-etched in a stripe form and electrically confined in the direction of the pumped laser.

However, the upper surface of the stripe is coated with an insulating layer 15 comprised of SiN exclusive of the top portion, and an upper electrode (P electrode) 16 comprised of Ti/Pt/Au is formed on the cap layer 14 in an ohmic contact by vapor deposition while covering the insulating layer 15. Further, on the lower surface of the semiconductor substrate 10, a lower electrode (N electrode) 17 comprised of AuGeNi/Au is formed in an ohmic contact by vapor deposition.

Figure 2:
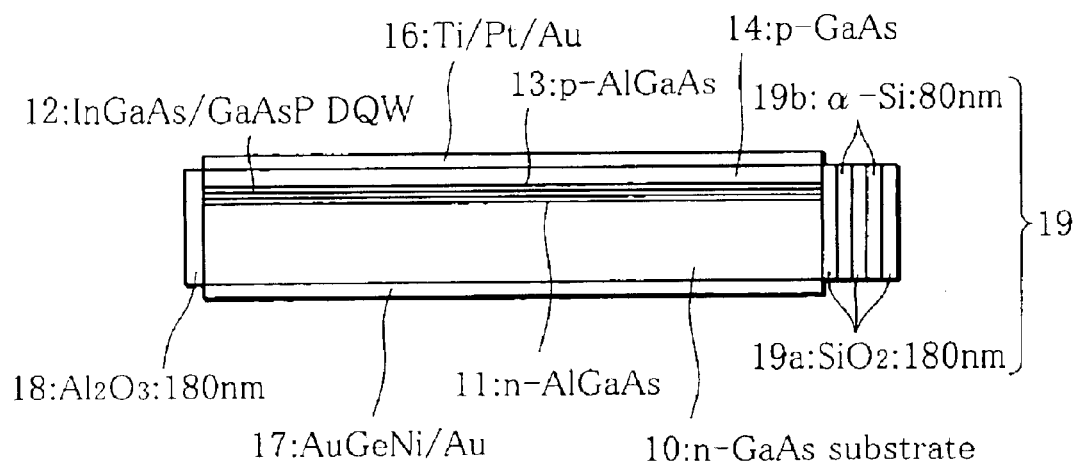
FIG. 2 is a diagrammatic cross-sectional structure view of the semiconductor laser device shown in FIG. 1 taken in the direction of the pumped laser.

On one of the opposite optical cavity ends (cleaved planes) formed by cleaving the multi-layer film semiconductor having the above device structure in the direction perpendicular to the junction planes of the individual layers, particularly, in the direction perpendicular to the stripe direction which is the direction of the pumped layer, a low reflection film 18 which is a single-layer comprised of an $Al_2O_3$ film is deposited as shown in FIG. 2, and a high reflection film 19 is deposited on the other end. The high reflection film 19 comprises a composite film formed by, for example, laminating an $SiO_2$ film 19a and an α-Si film 19b alternately five times. Alternatively, the high reflection film 19 may be formed by alternately laminating an $Al_2O_3$ film and an Si film. In this case, since the film in contact with the optical cavity end is an $Al_2O_3$ film, the alignment with the optical cavity end is excellent, as compared to that in the case where the $SiO_2$ film 19a is used, so that a remarkable effect of high reflection film 19 can be obtained.

Figure 3:
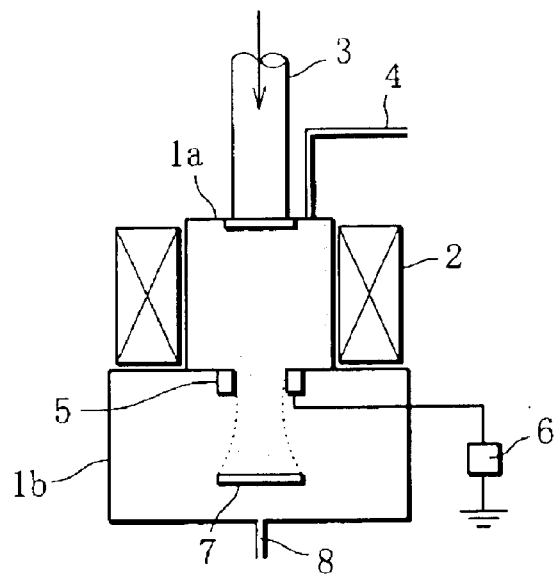
FIG. 3 is a view showing a diagrammatic construction of an ECR sputtering machine used for the deposition of the low reflection film in the semiconductor laser device of the present invention.

The characteristic feature of the semiconductor laser device of the present invention resides in that, as the low reflection film 18 deposited on one of the optical cavity ends, an $Al_2O_3$ film having a stoichiometric ratio composition and a resistivity of $1\times10^{12}$ Ω·m or more is used. The $Al_2O_3$ film having such a resistivity is deposited using, for example, an ECR sputtering machine of which diagrammatic construction is shown in FIG. 3.

This ECR sputtering machine is briefly described below. This machine comprises a plasma chamber 1a provided with a water-cooling system (not shown) and a sample chamber 1b communicating with the plasma chamber 1a. A magnetic coil 2 is provided around the plasma chamber 1a, and, on the upper portion of the plasma chamber 1a, a waveguide tube 3 for guiding a microwave and an introduction tube 4 for introducing a gas source, such as Ar, $O_2$ or the like, are provided. In the boundary of the plasma chamber 1a and sample chamber 1b, as a target 5 formed in a ring shape, Al is provided in this example, and the target 5 is connected with a sputtering power source 6.

The deposition of an $Al_2O_3$ film by means of the above ECR sputtering machine is performed as follows. A sample (laser device constituting an optical cavity) 7 is placed in the sample chamber 1b, and then, the sample chamber 1b and the plasma chamber 1a are first evacuated through an exhaust port 8 to achieve high vacuum. Then, the magnetic coil 2 and the sputtering power source 6 are operated while introducing a microwave at a predetermined frequency from the waveguide tube 3, and, when $O_2$ is introduced into the plasma chamber 1a from the introduction tube 4 in this state, an ECR discharge occurs in the plasma chamber 1a and an oxygen plasma with a high density is generated, so that this oxygen plasma becomes a plasma stream flowing toward the sample chamber 1b. In this instance, the peripheral portion of the above plasma stream impinges against the target 5, so that sputtering occurs. As a result, the reaction product ($Al_2O_3$) formed from the target (Al) 5 sputtered by the oxygen plasma is moved by the plasma stream and deposited onto the surface of the sample 7 placed in the sample chamber 1b. Thus, an $Al_2O_3$ film is formed on the surface of the sample 7.

The $Al_2O_3$ film having a resistivity of $1\times10^{12}$ Ω·m or more as the low reflection film 18 provided on the optical cavity end of the semiconductor laser device of the present invention is deposited by an ECR sputtering process by means of the above ECR sputtering machine. Particularly, in such an ECR sputtering process, as the target 5, Al per se which is a pure metal is used, and therefore, the $Al_2O_3$ film deposited on the optical cavity end has a stoichiometric ratio composition for the Al component and the oxygen component. As a result, since the $Al_2O_3$ film does not have the oxygen component in a stoichiometrically excess amount, no diffusion of the oxygen component occurs when the semiconductor laser device is driven, and hence, an oxidation of the optical cavity end does not occur. In addition, since the $Al_2O_3$ film does not stoichiometrically lack the oxygen component, no oxidation of the optical cavity end occurs due to the unexpected current flowing through the $Al_2O_3$ film.

Further, since the $Al_2O_3$ film has a resistivity as high as $1\times10^{12}$ Ω·m or more and an excellent heat dissipation property, the film also has a function of efficiently dissipating the heat generated by the driving of the semiconductor laser device. Accordingly, the increase in the temperature of the optical cavity end during the driving of the semiconductor laser device is effectively suppressed. Thus, the oxidation of the optical cavity end caused by the increase in temperature is also suppressed. Especially when the resistivity ρ of the $Al_2O_3$ film is $1\times10^{13}$ Ω·m or more, almost no catastrophic optical damage occurs, making it possible to enhance the operation reliability satisfactorily. Therefore, since an $Al_2O_3$ film is preferred from the viewpoint of realizing a large-output laser device which is continuously used over a long term, such as a semiconductor laser device used as an optical transmitter for the optical communication.

Figure 4:
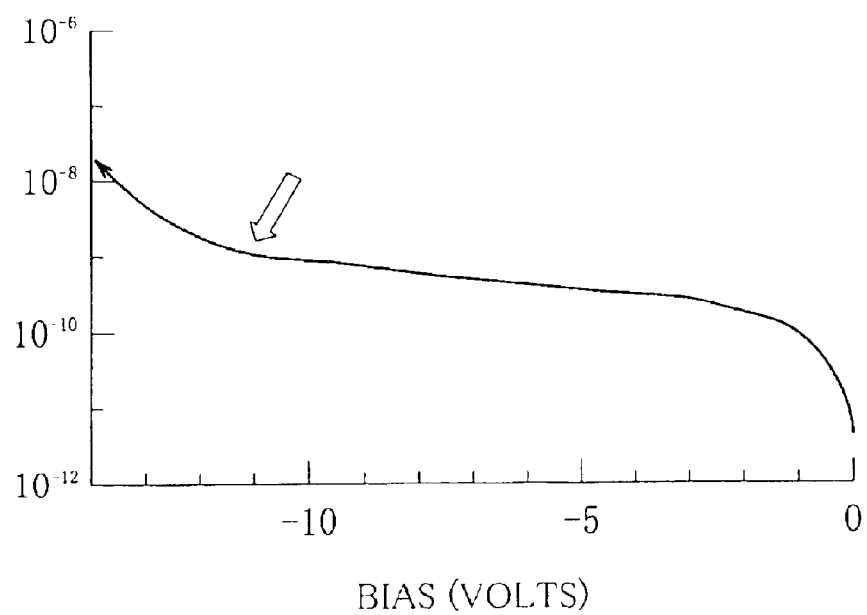
FIG. 4 is a view showing the V-I characteristics for the evaluation of the resistivity of an $Al_2O_3$ film.

By the way, the above-mentioned resistivity ρ (Ω·m) of the $Al_2O_3$ film can be evaluated as follows. Specifically, using an ECR sputtering machine, for example, when the low reflection film 18 is deposited on the optical cavity end, an $Al_2O_3$ film having a predetermined thickness (t) is simultaneously deposited on the Si substrate which is previously provided beside the semiconductor laser device, and an electrode having a certain area (S) is formed thereon by the general lift-off technique. Then, the V-I characteristics of the $Al_2O_3$ film deposited on the above Si substrate are measured under normal temperature conditions by means of a semiconductor parameter analyzer or the like, for example, as shown in FIG. 4. From the data measured, the current value (I) and the voltage value (V) before a point in time of the break down indicated by the arrow shown in FIG. 4 are individually determined, and the resistivity ρ (Ω·m) may be determined by making calculation in accordance with the following equation:

$$\rho = V \cdot S / (I \cdot t).$$

Figure 5:
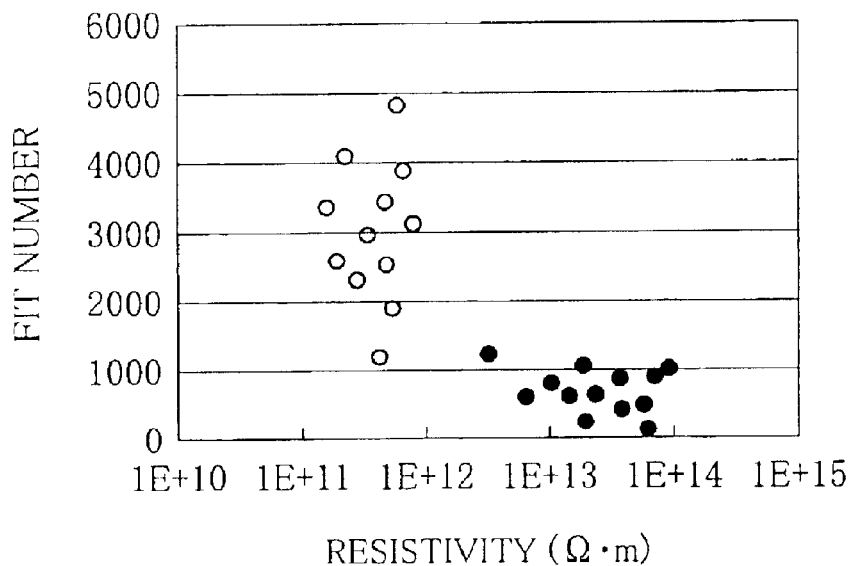
FIG. 5 is a view showing the relationship between the resistivity of an $Al_2O_3$ film and the duration of life of a semiconductor laser device.

When the resistivity ρ (Ω·m) of the $Al_2O_3$ film deposited using the ECR sputtering machine was determined, it has been confirmed that the $Al_2O_3$ film has a distribution of resistivity values as high as $5\times10^{12}$ to $1\times10^{14}$ Ω·m indicated by solid circles (●) in FIG. 5, and that, in the semiconductor laser device provided with this $Al_2O_3$ film as the low reflection film 18, the fault generation rate is low. As a comparison, the low reflection film 18 comprised of an $Al_2O_3$ film was deposited on the optical cavity end in the same manner using the general sputtering process, and the resistivity ρ (Ω·m) was determined. As a result, it has been confirmed that the $Al_2O_3$ film has a distribution of resistivity values as low as $1×10^{11}$ to $1×10^{12}$ Ω·m indicated by open circles (○) in FIG. 5, and that, in the semiconductor laser device provided with this $Al_2O_3$ film as the low reflection film 18, the fault generation rate is high.

It is noted that the fault in time (FIT) shown in FIG. 5 is an evaluation value for the operation reliability determined by the following equation:

$$FIT=([Fault\ number]×10^9)/([Operating\ time]×[Operating\ number]).$$

As is apparent from the above equation, the smaller the value of the FIT number, the higher the operation reliability (duration of life).

Specifically, as a semiconductor laser device having the device structure shown in FIG. 1, a semiconductor laser device lasing in a 980 nm zone, in which the active layer 12 has a quantum well structure comprised of InGaAs/GaAsP, the portion near the active layer is comprised of AlGaAs cladding layers 11, 13 and the length of the optical cavity is 800 μm, was produced. Then, on one end of the optical cavity, as the low reflection film 18, an $Al_2O_3$ film having a thickness of 190 nm was deposited by an ECR process, and on the other end, as the high reflection film 19, an $SiO_2/α$-Si composite film was deposited. In addition, as a comparison, the same semiconductor laser device as the above semiconductor laser device except that a low reflection film comprised of an $Al_2O_3$ film was deposited by the general sputtering process was prepared.

Figure 6:
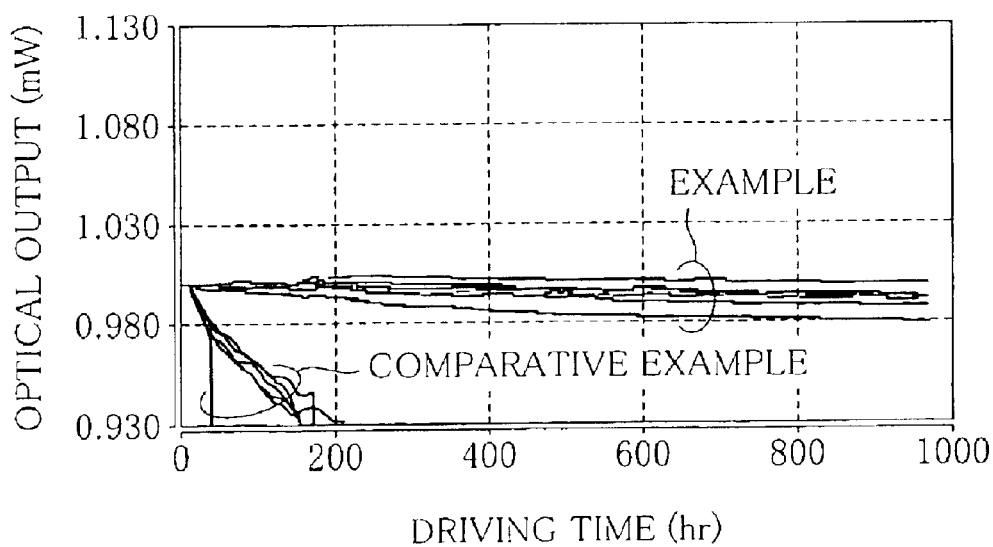
FIG. 6 is a graph showing the relationship between the lapse of the driving time of a laser device and the optical output thereof.

The thus produced plural semiconductor laser devices were driven at a constant current of 350 mA for 1000 hours, and the changes in optical output were examined, so that the results shown in FIG. 6 were obtained. As is apparent from the experimental results shown in FIG. 6, it has been confirmed that, in the semiconductor laser devices of the present invention, almost no lowering of the optical output occurs even after driving for 1000 hours. On the contrary, in the conventional semiconductor laser devices, results were obtained such that the lasing was terminated after the lapse of about 20 hours. When the resistivity of the $Al_2O_3$ film in each of the semiconductor laser devices of the present invention was measured as described above, the resistivity value was approximately $1×10^{13}$ Ω·m. By contrast, in the conventional semiconductor laser devices, the resistivity of the $Al_2O_3$ film was approximately $1×10^{11}$ Ω·m.

As is apparent from the above description, in the semiconductor laser device of the present invention, almost no lowering of the optical output occurs even after driving for a long time. The reason for this is nothing but because, as the low reflection film 18 on the optical cavity end, the $Al_2O_3$ film having a resistivity of $1×10^{12}$ Ω·m or more deposited by an ECR process is employed, so that the catastrophic optical damage is effectively prevented. In addition, in the large-output laser device, such as the semiconductor laser device lasing in a 980 nm zone according to the above-described embodiment, the oxidation of Al tends to be promoted, as compared to that in other devices, so that in such a case, by employing the present invention, a remarkable effect can be obtained.

It should be noted that the present invention is not limited to the above embodiment. In the embodiment, an explanation is made on the semiconductor laser device lasing in a 980 nm zone, but the present invention can also be applied to the semiconductor laser device lasing in a 1480 nm zone for use in the optical communication. In addition, as a process for depositing the $Al_2O_3$ film having a resistivity of $1×10^{12}$ Ω·m or more, an ECR process is used here, but an electron beam evaporation process, an electron beam sputtering process and the like can also be used. Further, the device structure of the semiconductor laser device is not limited to one shown in FIG. 1, and various structures can be employed.

In addition, in the above embodiment, an explanation was made on an example such that, as the high reflection film 19, a composite film formed by alternately laminating $SiO_2$ film 19a and α-Si film 19b was used, but, as a film which has a refractive index higher than that of $SiO_2$ film 19a, an Si film may be used instead of the above α-Si film 19b, and alternatively, an SiN film may be used.

Further, also when a film which contains an $Al_2O_3$ film is deposited as the high reflection film 19, the present invention can be applied. Specifically, also when, as the high reflection film 19, a composite film formed by alternately laminating an $Al_2O_3$ film and an Si film is used instead of the above-mentioned composite film formed by alternately laminating $SiO_2$ film 19a and α-Si film 19b, the $Al_2O_3$ film which has a resistivity as high as $1×10^{12}$ Ω·m or more and has a stoichiometric ratio composition may be used similarly to the case of low reflection film 18. By using high reflection film 19 containing the above $Al_2O_3$ film having a stoichiometric ratio composition, it becomes possible to suppress the occurrence of a catastrophic optical damage in the optical cavity on the high reflection film side, so that a more remarkable effect can be expected.

Furthermore, the low reflection film 18 may be formed as a film comprised of a plurality of layers. In this case, the low reflection film is realized as a composite film formed by alternately laminating an $Al_2O_3$ film which has a resistivity as high as $1×10^{12}$ Ω·m or more and has a stoichiometric ratio composition and a film which contains Si and has a refractive index higher than that of the above $Al_2O_3$ film.

Thus, the present invention can be widely applied to the semiconductor laser devices having a device structure such that the cleaved planes in the semiconductor multi-layer film formed by laminating optical confinement layers and active layers so as to dispose each of the active layers between the optical confinement layers serves as optical cavity ends, and the thickness of the $Al_2O_3$ film deposited on the optical cavity end as a reflection film and the like can be appropriately modified as long as the semiconductor laser device of the present invention can be obtained.

What is claimed is:

1. A semiconductor laser device comprising
   a semiconductor multi-layer film formed by laminating optical confinement layers and active layers so as to dispose each of said active layers between said optical confinement layers;
   a high reflection film coated on a first end of the multi-layer film perpendicular to junction planes of the individual layers in said semiconductor multi-layer film; and
   a low reflection film coated on a second end of the multi-layer film opposite to the first end and comprising essentially $Al_2O_3$ having a resistivity of $1×10^{12}$ Ω·m or more,
   wherein the semiconductor laser device has a fault in time (FIT) number of approximately 1000 or less when calculated using the formula: FIT=(fault number×$10^9$)/ (operating time×operating number).

2. The semiconductor laser device according to claim 1, wherein said resistivity of said $Al_2O_3$ film being in an inclusive range of $1\times10^{12}$ through $1\times10^{14}$ $\Omega \cdot m$.

3. The semiconductor laser device according to claim 2, wherein said low reflection film is formed from a single layer.

4. The semiconductor laser device according to claim 1, wherein said low reflection film is formed from a plurality of layers.

5. The semiconductor laser device according to claim 4, wherein said plurality of layers are a composite film formed from a film comprised of said $Al_2O_3$ and a film which contains Si and has a refractive index higher than that of said $Al_2O_3$.

6. The semiconductor laser device according to claim 5, wherein said film which has a refractive index higher than that of said $Al_2O_3$ is selected from the group consisting of Si, α(amorphous)-Si and SiN.

7. The semiconductor laser device according to claim 1, wherein said high reflection film contains a film comprised of at least $Al_2O_3$ having a resistivity of $1\times10^{12}$ $\Omega \cdot m$ or more.

8. The semiconductor laser device according to claim 7, wherein said high reflection film is a composite film formed from a film comprised of said $Al_2O_3$ and a film which contains Si and has a refractive index higher than that of said $Al_2O_3$.

9. A semiconductor laser device comprising:
  a semiconductor multi-layer film formed by laminating optical confinement layers and active layers so as to dispose each of said active layers between said optical confinement layers;
  a high reflection film coated on a first end of the multi-layer film perpendicular to junction planes of the individual layers in said semiconductor multi-layer film; and
  a low reflection film coated on a second end of the multi-layer film opposite to the first end and comprising essentially $Al_2O_3$ having a stoichiometric ratio composition,
  wherein the semiconductor laser device has a fault in time (FIT) number of approximately 1000 or less when calculated using the formula: FIT=(fault number×$10^9$)/ (operating time×operating number).

10. A semiconductor laser device comprising a semiconductor multi-layer film formed by laminating optical confinement layers and active layers so as to dispose each of said active layers between said optical confinement layers, wherein one of the opposite ends perpendicular to the junction planes of the individual layers in said semiconductor multi-layer film is coated with a low reflection film and the other of said ends is coated with a high reflection film, wherein said low reflection film contains a film comprised of $Al_2O_3$ having a stoichiometric ratio composition.

11. The semiconductor laser device according to claim 10, wherein said low reflection film is formed from a single layer.

12. The semiconductor laser device according to claim 10, wherein said low reflection film is formed from a plurality of layers.

13. The semiconductor laser device according to claim 12, wherein said plurality of layers are a composite film formed from a film comprised of said $Al_2O_3$ and a film which contains Si and has a refractive index higher than that of said $Al_2O_3$.

14. The semiconductor laser device according to claim 13, wherein said film which contains Si is selected from the group consisting of Si, α(amorphous)-Si and SiN.

15. The semiconductor laser device according to claim 10, wherein said high reflection film contains a film comprised of at least $Al_2O_3$ having a substantially stoichiometric ratio composition.

16. The semiconductor laser device according to claim 15, wherein said high reflection film is a composite film formed from a film comprised of said $Al_2O_3$ and a film which contains Si and has a refractive index higher than that of said $Al_2O_3$.

17. The semiconductor laser device according to claim 16, wherein said film which has a refractive index higher than that of said $Al_2O_3$ is selected from the group consisting of Si, α(amorphous)-Si and SiN.

18. The semiconductor laser device according to any one of claims 1 to 17, wherein said $Al_2O_3$ film is deposited by an electron cyclotron resonance plasma sputtering process.

19. A semiconductor laser device comprising:
  a semiconductor multi-layer film comprising at least one confinement layer and at least on active layer;
  a high reflection film substantially perpendicular to the semiconductor multi-layer film; and
  a low reflection film substantially perpendicular to the semiconductor multi-layer film, wherein the low reflection film comprises essentially $Al_2O_3$ having a stoichiometric ratio composition,
  wherein the semiconductor laser device has a fault in time (FIT) number of approximately 1000 or less when calculated using the formula: FIT=(fault number×$10^9$)/ (operating time×operating number).

20. A semiconductor laser device comprising:
  a semiconductor multi-layer film formed by laminating optical confinement layers and active layers so as to dispose each of said active layers between said optical confinement layers;
  a high reflection film coated on a first end of the multi-layer film perpendicular to junction planes of the individual layers in the semiconductor multi-layer film; and
  a low reflection film coated on a second end of the multi-layer film opposite to the first end and comprising $Al_2O_3$ having a resistivity of $1\times10^{12}$ $\Omega \cdot m$ or more, wherein the individual layers forming the semiconductor multi-layer film each being made of a semiconductor material simultaneously containing Ga and at least one of In, As, P and Al, and
  wherein the semiconductor laser device has a fault in time (FIT) number of approximately 1000 or less when calculated using the formula: FIT=(fault number×$10^9$)/ (operating time×operating number).

21. A semiconductor laser device formed by the process comprising:
  forming a semiconductor multi-layer film by laminating optical confinement layers and active layers so as to dispose each of said active layers between said optical confinement layers;
  forming a high reflection film coating on a first end of the multilayer film substantially perpendicular to junction planes of the individual layers and said semiconductor multilayer film; and
  forming a low reflection film coated on a second end of the multilayer film opposite the first end, wherein at least one of the high reflection film and low reflection film is formed such that the film comprises $Al_2O_3$ having a resistivity of $1\times10^{12}$ $\Omega \cdot m$ or more.

22. The semiconductor laser device of claim 21, wherein said forming at least one of the low reflection film and the high reflection film comprises depositing an $Al_2O_3$ film by an electron cyclotron resonance plasma sputtering process.

* * * * *

UNITED STATES PATENT AND TRADEMARK OFFICE
CERTIFICATE OF CORRECTION

PATENT NO. : 6,795,480 B1  Page 1 of 1
DATED : September 21, 2004
INVENTOR(S) : Kaya et al.

It is certified that error appears in the above-identified patent and that said Letters Patent is hereby corrected as shown below:

<u>Title page</u>,
Item [75], should read:
-- [75]  Inventors: Shusuke Kaya, Yokohama (JP);
      Takao Ninomiya, Yokohama (JP);
      Michio Ohkubo, Fujisawa (JP);
      Seiji Uchiyama, Fujisawa (JP) --.

Signed and Sealed this

Eleventh Day of April, 2006

JON W. DUDAS
*Director of the United States Patent and Trademark Office*